(12) United States Patent
Sunaga et al.

(10) Patent No.: US 9,318,821 B2
(45) Date of Patent: Apr. 19, 2016

(54) MULTIPOLAR CONNECTOR

(71) Applicant: NSK LTD., Shinagawa-ku, Tokyo (JP)

(72) Inventors: Takashi Sunaga, Tokyo (JP); Noboru Kaneko, Tokyo (JP); Osamu Miyoshi, Tokyo (JP)

(73) Assignee: NSK Ltd., Tokyo (JP)

( * ) Notice: Subject to any disclaimer, the term of this patent is extended or adjusted under 35 U.S.C. 154(b) by 0 days.

(21) Appl. No.: 14/401,887

(22) PCT Filed: Jan. 15, 2014

(86) PCT No.: PCT/JP2014/000168
§ 371 (c)(1),
(2) Date: Nov. 18, 2014

(87) PCT Pub. No.: WO2014/122883
PCT Pub. Date: Aug. 14, 2014

(65) Prior Publication Data
US 2015/0144392 A1   May 28, 2015

(30) Foreign Application Priority Data

Feb. 6, 2013 (JP) .................................. 2013-021528
Jan. 10, 2014 (JP) .................................. 2014-003285

(51) Int. Cl.
*H05K 1/00* (2006.01)
*H01R 12/52* (2011.01)
(Continued)

(52) U.S. Cl.
CPC .............. *H01R 12/523* (2013.01); *H01R 12/58* (2013.01); *H01R 13/405* (2013.01); *H01R 43/24* (2013.01);
(Continued)

(58) Field of Classification Search
CPC .......... H01R 9/24; H01R 12/16; H01R 12/22; H01R 12/523; H01R 12/58; H01R 12/721; H01R 13/05; H01R 13/40; H01R 13/73; H01R 13/405; H01R 13/639; H01R 24/00; H01R 43/00; H01R 43/16; H01R 43/24; H01R 12/04; H01R 13/24; H01R 2107/00; H05K 1/00; H05K 1/14; H05K 1/115; H05K 1/181; H05K 1/144; H05K 3/341; H05K 5/02; H05K 2201/1028; H05K 2201/10522; B29C 33/14; B29C 45/14; B29C 45/14065; B29C 45/14836; B29C 70/72
USPC ........... 264/272.15, 275, 278; 439/78, 79, 83, 439/736; 425/117, 125, 129.1; 174/262, 174/71 R
See application file for complete search history.

(56) References Cited

U.S. PATENT DOCUMENTS 4,054,345 A * 10/1977 Sherwood ............ H01R 12/716
439/381

(Continued)

FOREIGN PATENT DOCUMENTS

JP    51-7635       1/1976
JP    5-698887 U    9/1993

(Continued)

OTHER PUBLICATIONS

International Search Report (PCT/ISA/210) dated Apr. 22, 2014, with English translation (four (4) pages).
(Continued)

*Primary Examiner* — Timothy Thompson
*Assistant Examiner* — Guillermo Egoavil
(74) *Attorney, Agent, or Firm* — Crowell & Moring LLP

(57) ABSTRACT

A multipolar connector is provided. It is possible to prevent deformation of a particular pin-shaped terminal of plural pin-shaped terminals arranged in a line in a direction perpendicular to a connection direction of the multipolar connector, and also possible to prevent positional displacements of the particular pin-shaped terminal and other pin-shaped terminals. The multipolar connector (101) includes plural pin-shaped terminals (110) arranged in a line in a direction (arrow X direction) perpendicular to a connection direction (arrow Y direction) of the multipolar connector to extend in the connection direction, and a hold member (120) configured to extend in the direction perpendicular to the connection direction and hold the plural pin-shaped terminals (110) at a predefined pitch.

5 Claims, 15 Drawing Sheets

(51) Int. Cl.
    *H01R 13/405*     (2006.01)
    *H01R 43/24*     (2006.01)
    *H01R 12/58*     (2011.01)
    *H05K 1/11*     (2006.01)
    *H05K 1/14*     (2006.01)
    *H05K 1/18*     (2006.01)
    *H05K 3/24*     (2006.01)
    *H01R 107/00*     (2006.01)

(52) U.S. Cl.
    CPC ............... *H05K 1/115* (2013.01); *H05K 1/144* (2013.01); *H05K 1/181* (2013.01); *H05K 3/241* (2013.01); *H01R 2107/00* (2013.01); *H05K 2201/042* (2013.01); *H05K 2201/1028* (2013.01); *H05K 2201/10303* (2013.01); *H05K 2201/10424* (2013.01); *H05K 2201/10522* (2013.01)

(56) References Cited

U.S. PATENT DOCUMENTS

| | | | |
|---|---|---|---|
| 4,420,877 A * | 12/1983 | McKenzie, Jr. | H05K 3/308 228/180.1 |
| 6,153,140 A | 11/2000 | Hirai et al. | |
| 2001/0006854 A1 | 7/2001 | Moriwake et al. | |
| 2013/0203296 A1* | 8/2013 | Ngo | 439/638 |
| 2013/0217278 A1* | 8/2013 | Shiraishi et al. | 439/733.1 |
| 2015/0311608 A1* | 10/2015 | Schwartz | H01R 12/585 439/65 |

FOREIGN PATENT DOCUMENTS

| | | | |
|---|---|---|---|
| JP | H0569887 U | * | 9/1993 |
| JP | H 0569887 U | * | 9/1993 |
| JP | 9-171880 A | | 6/1997 |
| JP | 10284158 A | * | 10/1998 |
| JP | 10284158 A | * | 10/1998 |
| JP | 11-154578 A | | 6/1999 |
| JP | 2001-76799 A | | 3/2001 |
| JP | 2001-85087 A | | 3/2001 |
| JP | 2007-242473 A | | 9/2007 |

OTHER PUBLICATIONS

Written Opinion (PCT/ISA/237) dated Apr. 22, 2014, with English translation (eight (8) pages).

* cited by examiner

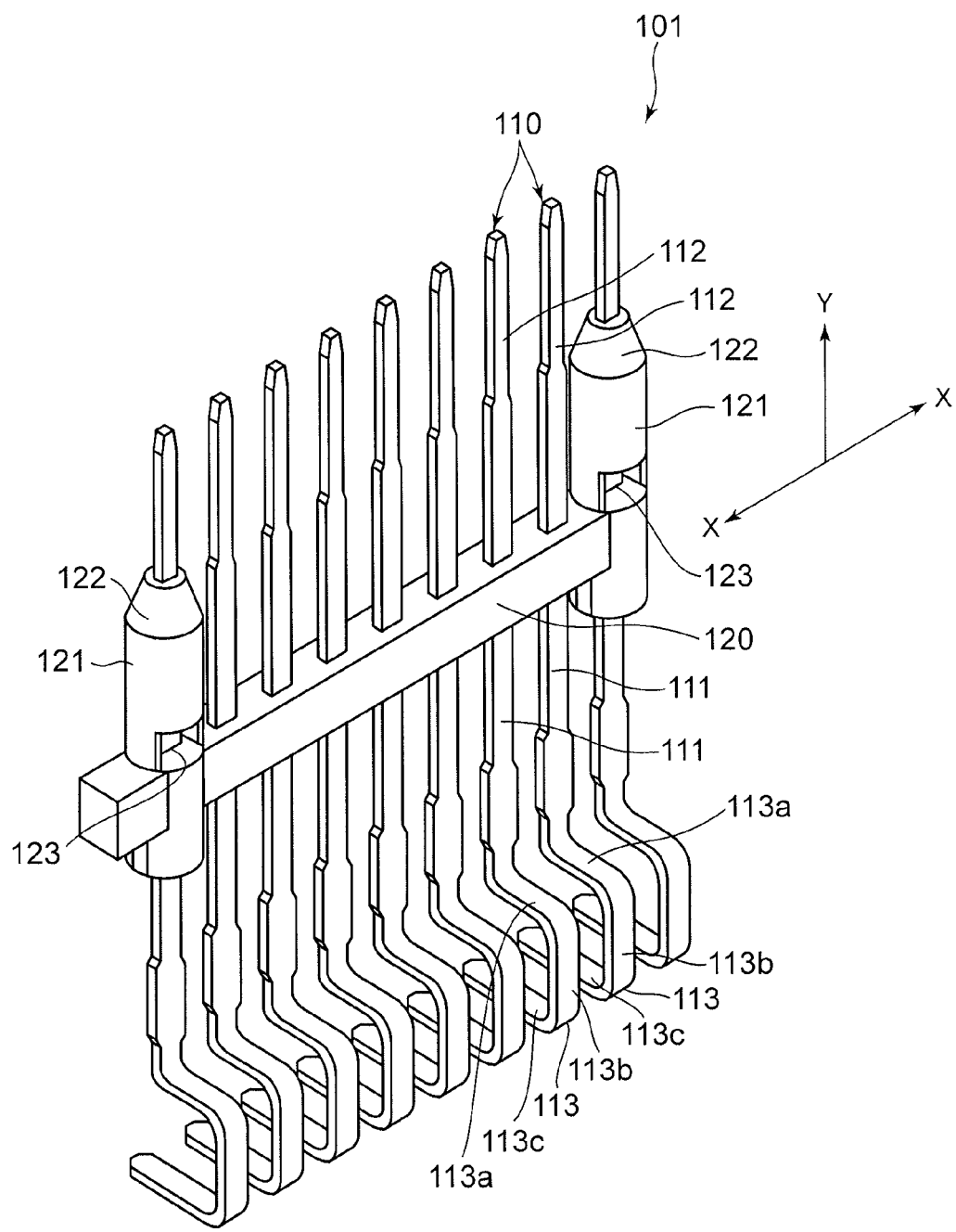

MULTIPOLAR CONNECTOR

TECHNICAL FIELD

The present disclosure relates to a multipolar connector to interconnect circuit boards on each of which electronic parts are mounted.

BACKGROUND ART

For example, in an electronic apparatus for driving the control for an electric power steering apparatus in a vehicle such as a car or the like, a power circuit board on which a power device such as a high FET (Field Effect Transistor), IGBT (Insulated Gate Bipolar Transistor) or the like with a large current being flown to lead to a high heat buildup is mounted is separated from a control circuit board. Then, such a power circuit board and a control circuit board are arranged parallel and spaced apart from each other at a predefined interval. For example, the power circuit board is provided on the housing bottom side, whereas the control circuit board is provided above the power circuit board to be spaced apart at a predefined distance. In this case, a connector to electrically interconnect these two circuit boards is needed.

As an example of the multipolar connector in one technology to interconnect the circuit boards on each of which electronic parts are mounted, for example, the connector illustrated in FIG. 13 is known (see PLT 1).

A multipolar connector 201 illustrated in FIG. 13 includes plural pin-shaped terminals 202 arranged at a predefined pitch in a line perpendicularly to a connection direction, and insulation members 203A and 203B holding the pin-shaped terminals 202. In each pin-shaped terminal 202, a dogleg-shaped curved section 203 bent at a substantially center in an extension direction is formed. An upper board connection section 204 to be soldered with an upper circuit board is formed (not illustrated) at an upper end part of the extension direction of each pin-shaped terminal 202, whereas a letter S-shaped curved section 205 to be bent in a letter S shape is formed at a lower end part of the extension direction. A lower board connection section 206 to be soldered for connection with a lower circuit board (not illustrated) is formed at the lower end part of the letter S-shaped curved section 205. Then, the upper board connection section 204 is inserted through a through hole formed on the upper circuit board (for example, a control circuit board), and is soldered for connection, whereas the lower board connection section 206 is mounted on the face of the lower circuit board (for example, power circuit board), and is soldered for connection.

Then, in the multipolar connector 201, the plural pin-shaped terminals 202 can be integrated by the insulation members 203A and 203B, and in addition, the upper board connection section 204 and the lower board connection section 206 in each pin-shaped terminal 202 can be positioned. Further, when stress applied to each pin-shaped terminal 202 from the outside for some reason, the dogleg-shaped curved section 203 and the letter S-shaped curved section 205 transform according to the stress, so that the stress can be relieved.

Furthermore, as another example of the multipolar connector to interconnect the circuit boards on each of which electronic parts are mounted, for example, the connector illustrated in FIG. 14 and FIG. 15 is also known (see PLT 2).

In a multipolar connector 301 illustrated in FIG. 14A and FIG. 14B, middle parts of plural connection conductors 302 are integrally adhered by an insulation plate 303 firmly, with the plural connection conductors 302 being arranged in parallel, and folded sections 304 or protrusions (not illustrated) are provided at predefined positions protruding from the insulation plate 303. Then, as illustrated in FIG. 15, the protrusion parts of the connection conductor 302 are penetrated through a pair of wiring boards 310 and 320, respectively, so that spacing between the wiring boards 310 and 320 is immobilized by the folding section 304.

Moreover, for example, the connector illustrated in FIG. 16 is also known as a further another example (see PTL 3).

In a multipolar connector 401 illustrated in FIG. 16, a metal board is punched out so that standard pressure contact terminals 401A and 401B including a pair of pressure contact parts 411a and 411b and tab sections 412a and 412b are continuous with their tab sections 412a and 412b, respectively.

Thus, plural terminals are linked horizontally and the tab sections 412a and 412b of the standard pressure contact terminals 401A and 401B are coupled by a resin material 420. By coupling the respective tab sections 412a and 412b of the standard pressure contact terminals 401A and 401B with a resin material 420, the respective tab sections 412a and 412b of the standard pressure contact terminals 401A and 401B can be positioned collectively.

CITATION LIST

Patent Literature

PTL 1: JP 2007-242473 A
PTL 2: JP S51-7635 A
PTL 3: JP H11-154578 A

SUMMARY OF INVENTION

Technical Problem

In the multipolar connectors 201, 301, and 401 in some technologies illustrated in FIG. 13 to FIG. 16, however, there are following drawbacks.

That is, in the case of the multipolar connector 201 illustrated in FIG. 13, the plural pin-shaped terminals 202 can be integrated by the insulation members 203A and 203B, and in addition, the upper board connection section 204 and the lower board connection section 206 in each pin-shaped terminal 202 can be positioned. However, since each pin-shaped terminal 202 is formed in minimum thinness, when the upper board connection section 204 is inserted through a through hole formed in the upper circuit board and soldered for connection, or when the multipolar connector 201 is transported, some kind of external force might be exerted and deformation might occur. When the deformation occurs at a particular one of the plural pin-shaped terminals 202, positional displacement occurs at the particular pin-shaped terminal 202. Besides, when the deformation occurs at a particular one of the plural pin-shaped terminals 202, the positional displacement might occur at another pin-shaped terminal 202 via the insulation members 203A and 203B. When the positional displacement occurs at each pin-shaped terminal 202, in particular, when the positional displacement occurs at the upper board connection section 204, the upper board connection section 204 might not be inserted through the through hole formed in the upper circuit board.

Further, even in the case of the multipolar connector 301 illustrated in FIG. 14 and FIG. 15, as the connection conductor 302 is formed in pin shape and minimum thinness, a similar drawback to the multipolar connector 201 illustrated in FIG. 13 occurs.

Furthermore, in the case of the multipolar connector 401 illustrated in FIG. 16, the standard pressure contact terminals 401A and 401B have the tab sections 412a and 412b, respectively, and have relatively large widths, but when some kind of external force is exerted, the deformation might occur after all. Thus, a similar drawback to the multipolar connector 201 illustrated in FIG. 13 occurs.

Accordingly, the present disclosure has been made to solve the drawbacks of some technologies, and has an object to provide a multipolar connector in which it is possible to prevent deformation of a particular pin-shaped terminal of plural pin-shaped terminals arranged in a line in a direction perpendicular to a connection direction of the multipolar connector, and it is also possible to prevent positional displacements of the particular pin-shaped terminal and other pin-shaped terminals.

Solution to Problem

In order to address the above drawbacks, in some embodiments of the present disclosure, there is provided a multipolar connector including: a plurality of pin-shaped terminals arranged in a line in a direction perpendicular to a connection direction of the multipolar connector and each of the plurality of pin-shaped terminals extending in the connection direction; a hold member extending in the direction perpendicular to the connection direction and holding the plurality of pin-shaped terminals at a predefined pitch; and a protection section configured to protect a particular pin-shaped terminal of the plurality of pin-shaped terminals at a part of the hold member, the protection section extending from the hold member to protrude in the connection direction of the particular pin-shaped terminal to be protected and covering around the particular pin-shaped terminal.

According to the above-described multipolar connector, the protection section is provided to protect a particular pin-shaped terminal of the plurality of pin-shaped terminals at a part of the hold member, the protection section extending from the hold member to protrude in the connection direction of the particular pin-shaped terminal to be protected and covering around the particular pin-shaped terminal. It is therefore possible to protect the particular pin-shaped terminal when the multipolar connector is connected to a circuit board, the multipolar connector is transported, or the like, and even if some kind of external force is exerted onto the particular pin-shaped terminal, it is possible to prevent deformation of the particular pin-shaped terminal. Thus, the positional displacement of the particular pin-shaped terminal can be avoided, and in addition, the positional displacement of other pin-shaped terminals caused by the deformation of the particular pin-shaped terminal can be avoided, too. Accordingly, the pin-shaped terminals of the multipolar connector can be inserted into the through holes, respectively, of the circuit board appropriately and smoothly.

BRIEF DESCRIPTION OF DRAWINGS

FIG. 8 is a perspective view of a first modification example of the multipolar connector;

DESCRIPTION OF EMBODIMENTS

Figure 1:
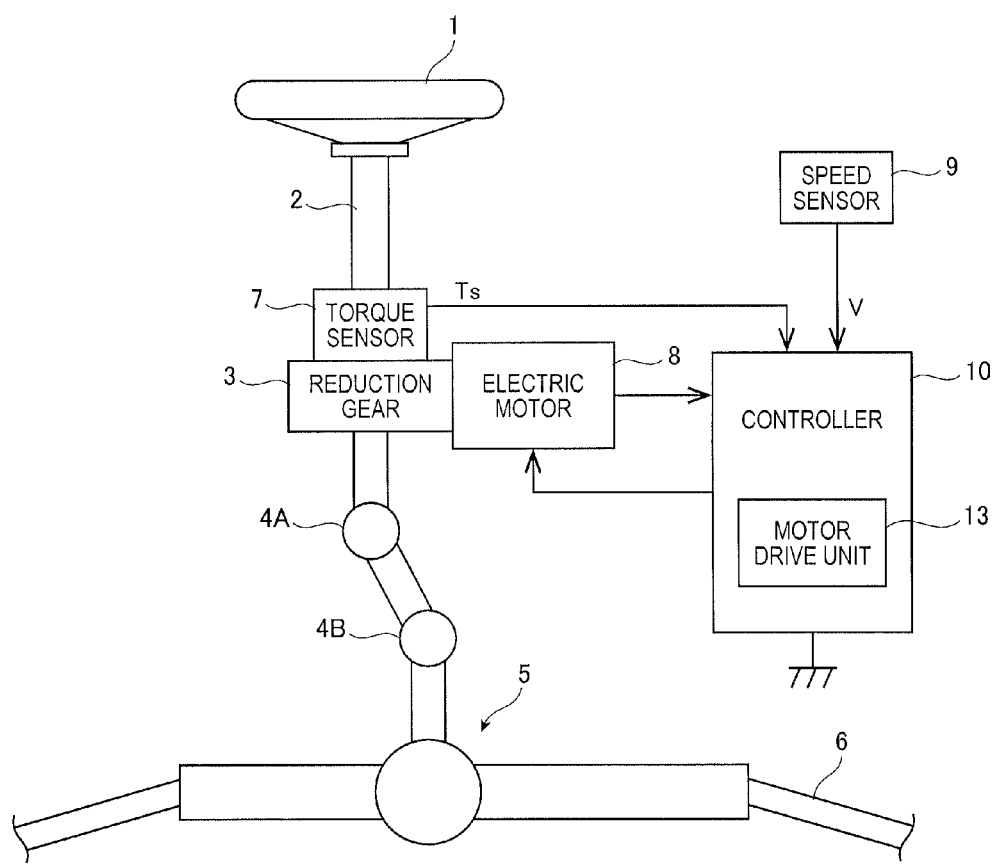
FIG. 1 is a view illustrative of a basic structure of an electric power steering apparatus in which a multipolar connector in some embodiments of the present disclosure is used.
Figure 2:
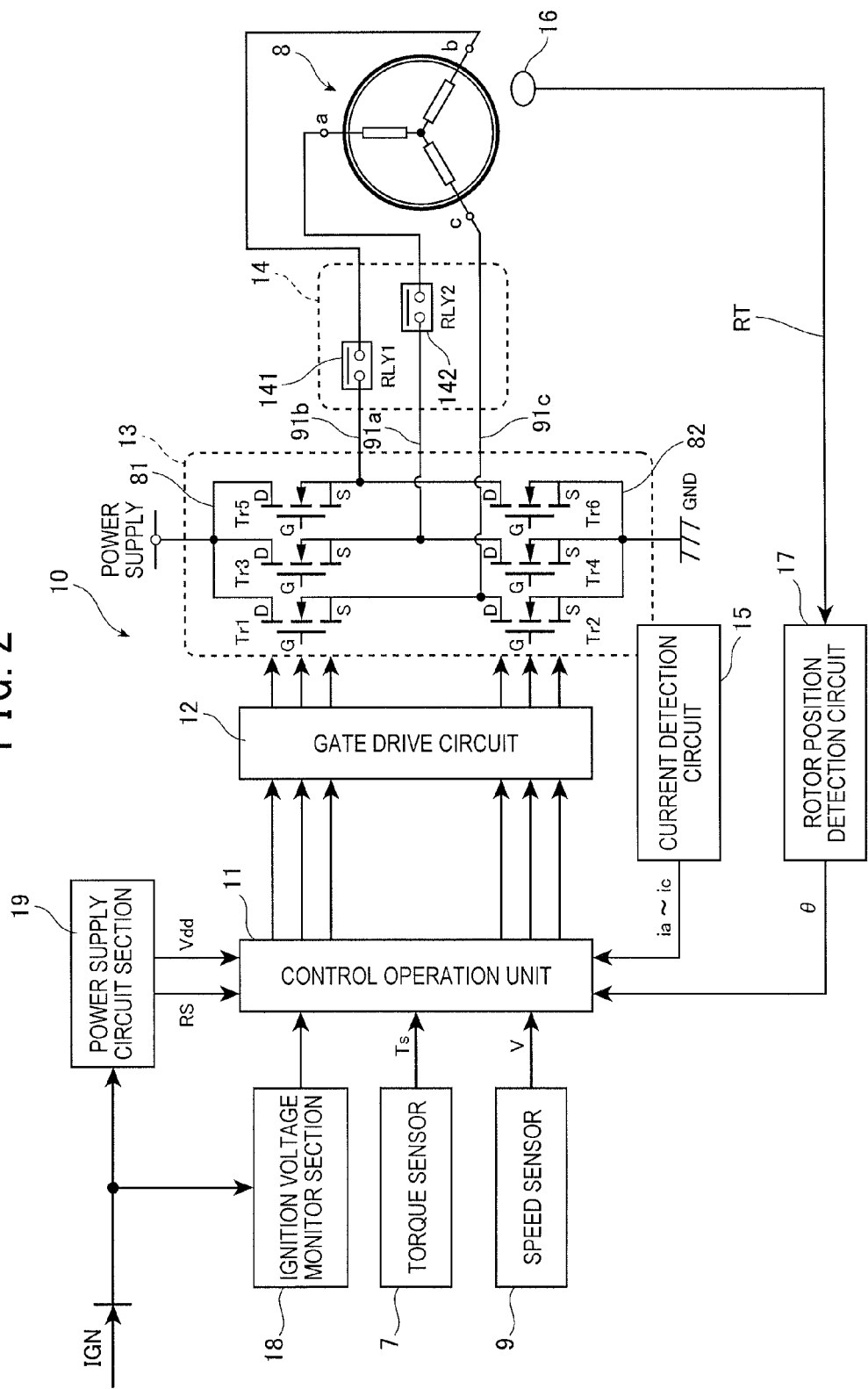
FIG. 2 is a block diagram illustrative of a control system of a controller of the electric power steering apparatus illustrated in FIG. 1.
Figure 3:
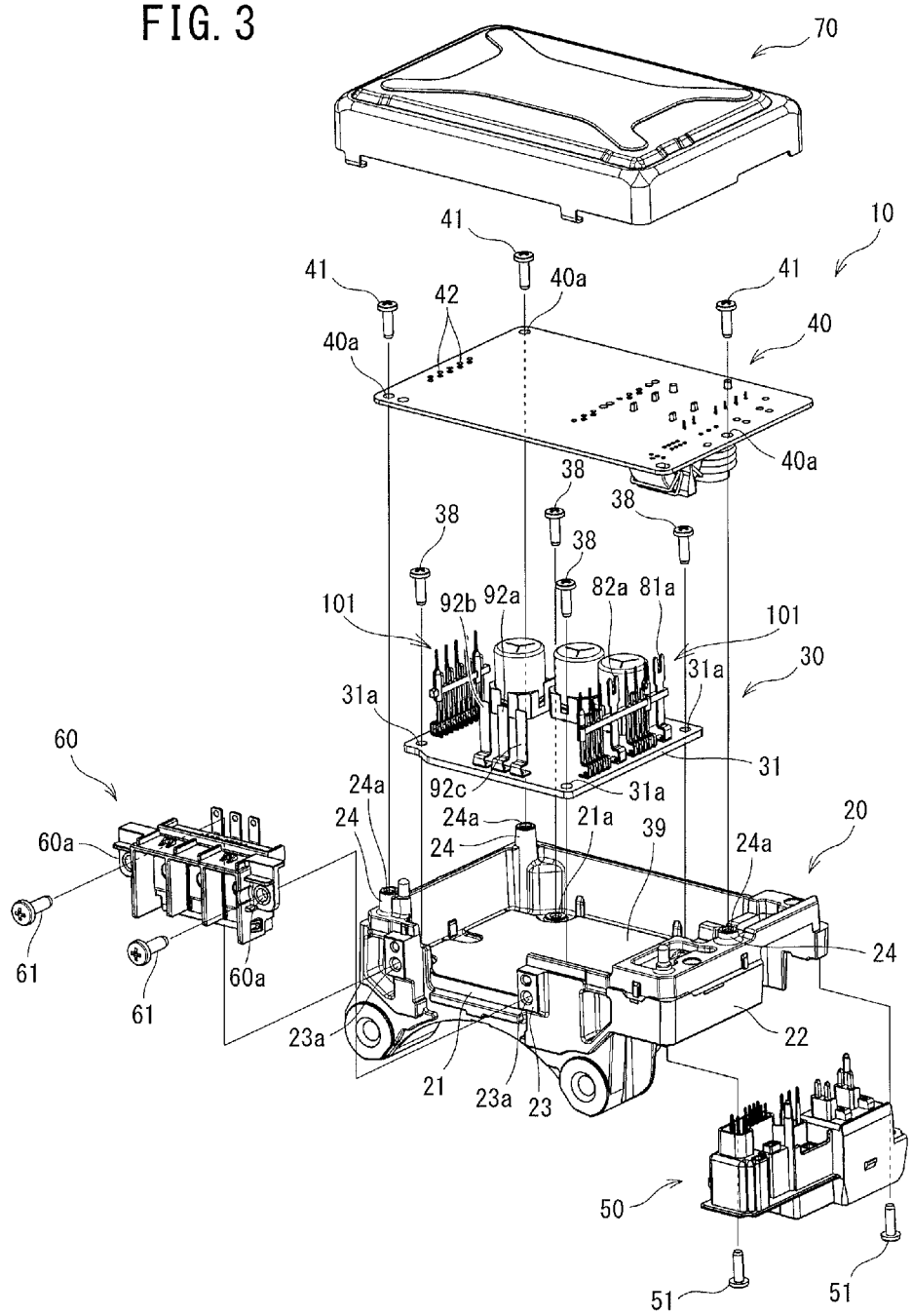
FIG. 3 is an exploded perspective view of the controller including a semiconductor module (i.e. power circuit board) on which the multipolar connector of the electric power steering apparatus illustrated in FIG. 1.

Hereinafter, embodiments of the present disclosure will be described with reference to the attached drawings. FIG. 1 is a view illustrative of a basic structure of an electric power steering apparatus in which a multipolar connector in some embodiments of the present disclosure is used. FIG. 2 is a block diagram illustrative of a control system of a controller of the electric power steering apparatus illustrated in FIG. 1. FIG. 3 is an exploded perspective view of the controller including a semiconductor module (i.e. power circuit board) on which the multipolar connector of the electric power steering apparatus illustrated in FIG. 1.

The basic structure of the electric power steering apparatus in which the multipolar connector in some embodiments of the present disclosure is used is illustrated in FIG. 1. In the electric power steering apparatus, a column shaft 2 of a steering wheel 1 is connected to a tight rod 6 of a steering wheel through a reduction gear 3, universal joints 4A and 4B, and a rack and pinion mechanism 5. A torque sensor 7 configured to detect a steering torque of the steering wheel 1 is provided in the column shaft 2, and an electric motor 8 that assists a steering force of the steering wheel 1 is connected to the column shaft 2 via the reduction gear 3. Power is supplied from a battery (not illustrated) to a controller 10 configured to control the electric power steering apparatus, and an ignition key signal IGN (see FIG. 2) is input to the controller 10 through an ignition key (not illustrated). The controller 10 calculates a steering assist instruction value that is an assist (steering assist) instruction based on a steering torque Ts detected by the torque sensor 7 and a vehicle speed V detected by a vehicle speed sensor 9, and controls a current supplied to the electric motor 8 based on the steering assist instruction value that has been calculated.

The controller 10 mainly includes a microcomputer, but FIG. 2 illustrates the mechanism and configuration of the control device.

The steering torque Ts detected by the torque sensor 7 and the vehicle speed V detected by the speed sensor 9 are input to a control operation unit 11 as a control calculator, and the current instruction value calculated by the control operation unit 11 is input to a gate drive circuit 12. A gate drive signal formed in the gate drive circuit 12 based on the current instruction value or the like is input to a motor drive unit 13 having a bridge configuration of FET. The motor drive unit 13 drives the electric motor 8 including a three-phase brushless motor through a cutoff device 14 for emergency stop. Each phase current of the three-phase brushless motor is detected by a current detection circuit 15, and the detected three phase motor currents is to is are input as feedback currents to the control operation unit 11. In addition, a rotation sensor 16 such as a hall sensor is attached to the electric motor 8, so that a rotation signal RT from the rotation sensor 16 is input to a rotor position detection circuit 17 and the detected rotation position θ is input to the control operation unit 11.

In addition, the ignition signal IGN from the ignition key is input to an ignition voltage monitor section 18 and a power supply circuit section 19. When a power supply voltage Vdd is input to the control operation unit 11 from the power supply circuit section 19, a reset signal Rs which can be used for stopping the operation of the apparatus is input to the control operation unit 11. Further, the cutoff device 14 includes relay contacts 141 and 142 for interrupting the two phases.

Moreover, the circuit configuration of the motor drive unit 13 will be described. FETs Tr1 and Tr2, FETs Tr3 and Tr4, and FETs Tr5 and Tr6 serially connected to a power line 81 are connected in parallel. In addition, FETs Tr1 and Tr2, FETs Tr3 and Tr4, and FETs Tr5 and Tr6 connected in parallel to the power line 81 are connected to a ground line 82. Thus, an inverter is configured. Here, as to the FETs Tr1 and Tr2, a source electrode S of the FET Tr1 and a drain electrode D of the FET Tr2 are serially connected to form a c-phase arm of the three-phase motor, and an electrical current is output in a c-phase output line 91c. Further, as to the FETs Tr3 and Tr4, a source electrode S of the FET Tr3 and a drain electrode D of the FET Tr4 are serially connected to form an a-phase arm of the three-phase motor, and an electrical current is output in an a-phase output line 91a. Furthermore, as to the FETs Tr5 and Tr6, a source electrode S of the FET Tr5 and a drain electrode D of the FET Tr6 are serially connected to form a b-phase arm of the three-phase motor, and an electrical current is output in a b-phase output line 91b.

Next, FIG. 3 is an exploded perspective view of the controller 10 including a semiconductor module (i.e., power circuit board) on which the multipolar connector of the electric power steering apparatus illustrated in FIG. 1 is mounted. The controller 10 includes a case 20, a semiconductor module 30 as a power module including the motor drive unit 13, a heat radiation sheet 39, a control circuit board 40 including the control operation unit 11 and the gate drive circuit 12, a power and signal connector 50, a three-phase output connector 60, and a cover 70.

Here, the case 20 is formed to have a substantially rectangular shape, and includes a plate-shaped semiconductor module mount section 21 on which the semiconductor module 30 is mounted, a power and signal connector mount section 22, for mounting the power and signal connector 50, provided at an end part in the length direction of the semiconductor module mount section 21, and a three-phase output connector mount section 23, for mounting the three-phase output connector 60, provided at an end part in the width direction of the semiconductor module mount section 21.

In addition, plural screw openings 21a into which attachment screws 38 to attach the semiconductor module 30 are screwed are provided in the semiconductor module mount section 21, respectively. Further, plural attachment posts 24 for attaching the control circuit board 40 standup in the semiconductor module mount section 21 and the power and signal connector mount section 22, and plural screw openings 24a into which attachment screws 41 for attaching the control circuit board 40 are screwed are provided in each of the attachment posts 24, respectively. Furthermore, plural screw openings 23a into which attachment screws 61 to attach the three-phase output connector 60 are screwed are provided in the three-phase output connector mount section 23, respectively.

Figure 4:
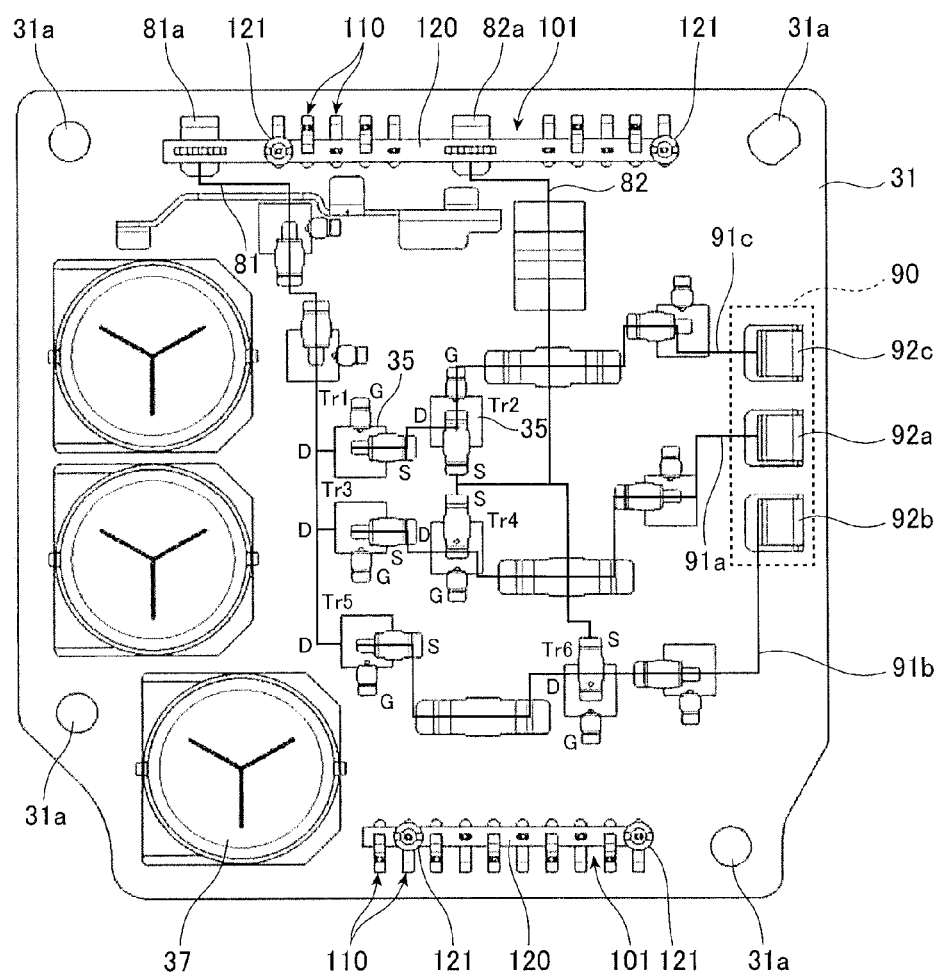
FIG. 4 is a plane view of the semiconductor module (i.e. power circuit board) illustrated in FIG. 3.

In addition, the semiconductor module 30 is a power circuit board, and has a circuit configuration of the above-described motor drive unit 13. As illustrated in FIG. 4, six FETs Tr1 to Tr6, a positive terminal 81a connected to the power line 81 and a negative terminal 82a connected to the ground line 82 are mounted on a board 31. Each of the FETs Tr1 to Tr6 is configured with a bare chip FET (i.e., bare chip transistor) 35. Further, a three-phase output section 90 including an a-phase output terminal 92a connected to the a-phase output line 91a, a b-phase output terminal 92b connected to the b-phase output line 91b, and a c-phase output terminal 92c connected to the c-phase output line 91c is mounted on the board 31. Furthermore, other surface mount parts 37 including a capacitor are mounted on the board 31. Furthermore, plural through openings 31a through which attachment screws 38 to attach the semiconductor module 30 to the case 20 are inserted are mounted on the board 31 of the semiconductor module 30.

Additionally, the control circuit board 40 configures a control circuit including the control operation unit 11 and the gate drive circuit 12, by mounting plural electronic parts on a board. The control circuit board 40 is attached by the plural attachment screws 41 from above of the semiconductor module 30 onto the plural attachment posts 24 standing up from the semiconductor module mount section 21 and the power and signal connector mount section 22, and plural through openings 40a into which the attachment screws 41 are respectively inserted are provided in the control circuit board 40.

Then, as illustrated in FIG. 3 and FIG. 4, plural multipolar connectors 101 are mounted on the semiconductor module 30. The semiconductor module 30 and the control circuit board 40 are interconnected by the multipolar connectors 101.

Figure 5:
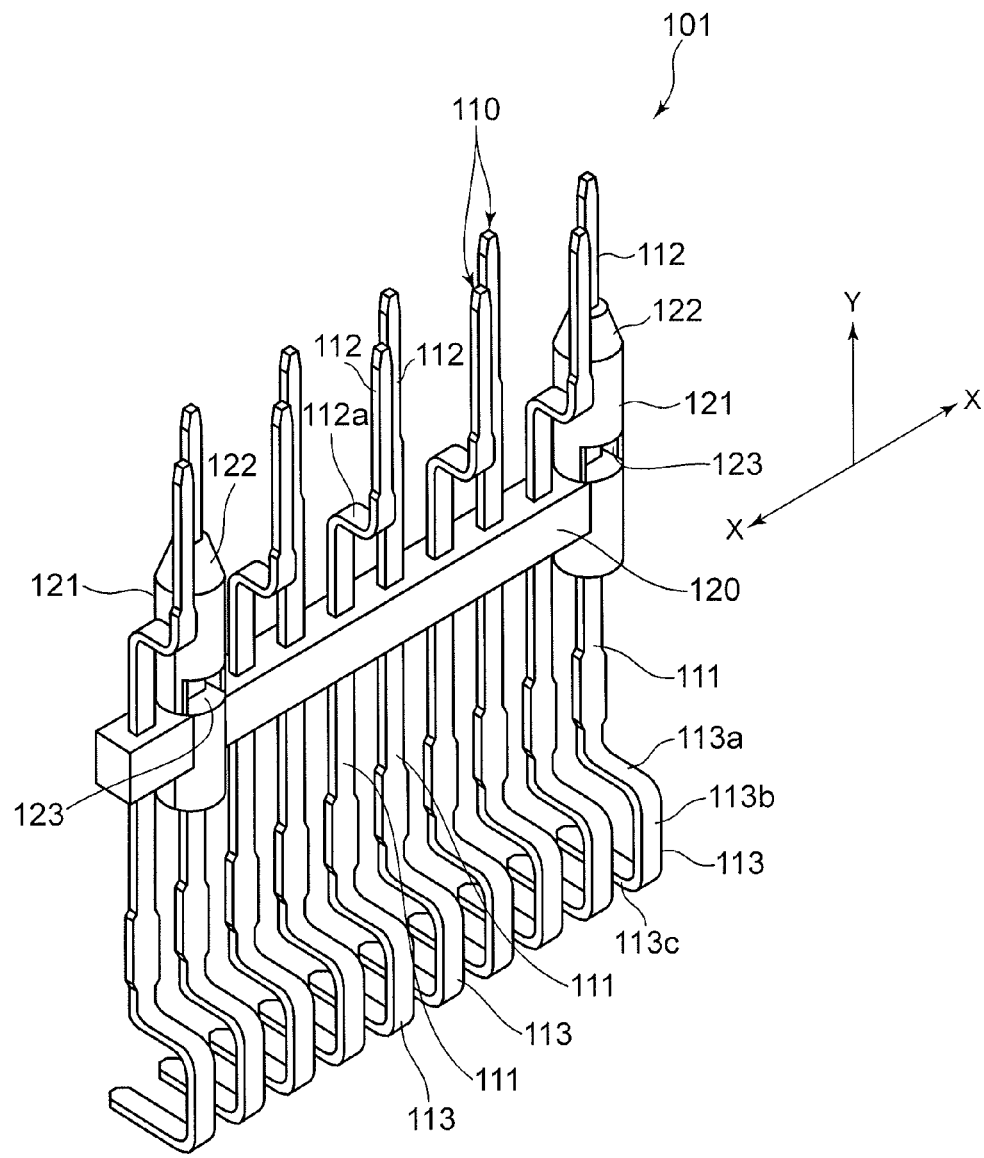
FIG. 5 is a perspective view illustrative of a multipolar connector.
Figure 6A:
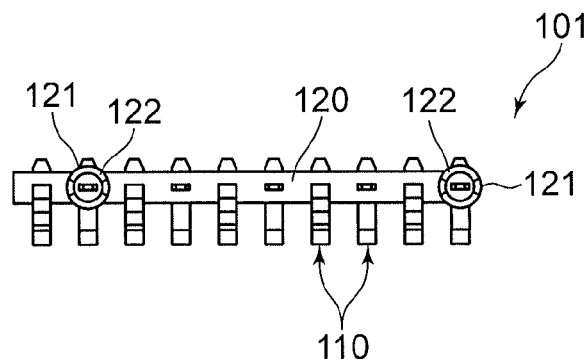
FIG. 6A is a plane view of the multipolar connector of FIG. 5.
Figure 6B:
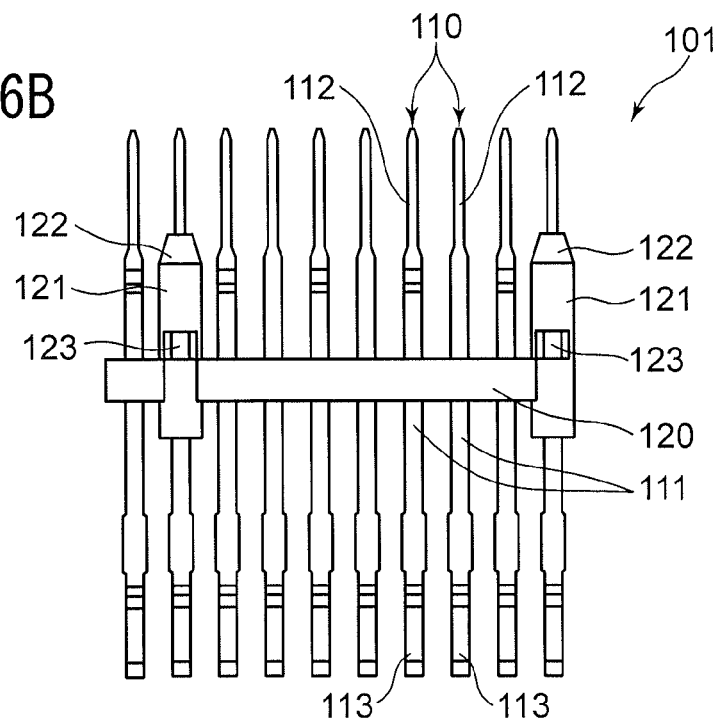
FIG. 6B is a front view of the multipolar connector of FIG. 5.
Figure 6C:
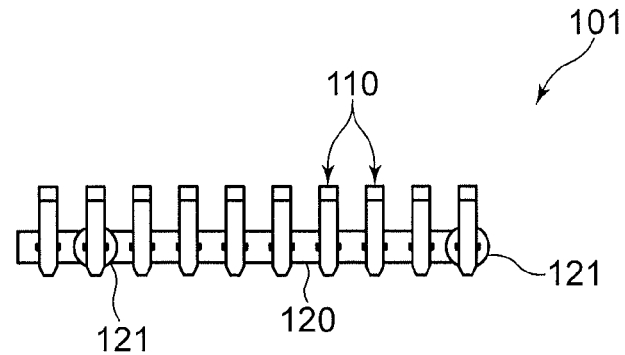
FIG. 6C is a bottom view of the multipolar connector of FIG. 5.
Figure 7A:
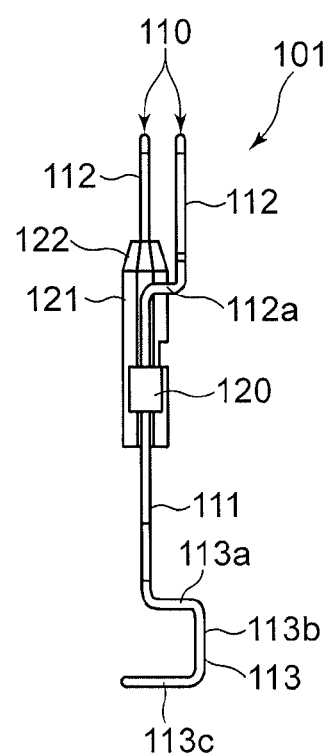
FIG. 7A is a left side view of the multipolar connector of FIG. 5.
Figure 7B:
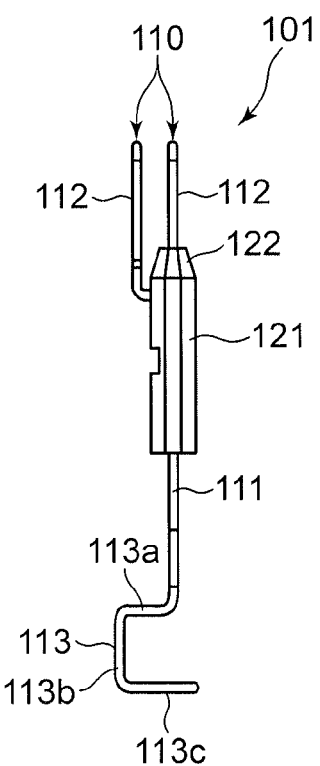
FIG. 7B is a right side view of the multipolar connector of FIG. 5.

Here, the multipolar connector 101 will be described with reference to FIG. 5 to FIG. 7B in detail. FIG. 5 is a perspective view illustrative of a multipolar connector. FIG. 6A is a plane view of the multipolar connector of FIG. 5, FIG. 6B is a front view of the multipolar connector of FIG. 5, and FIG. 6C is a bottom view of the multipolar connector of FIG. 5. FIG. 7A is a left side view of the multipolar connector of FIG. 5, and FIG. 7B is a right side view of the multipolar connector of FIG. 5.

In FIG. 5, the multipolar connector 101 includes plural pin-shaped terminals 110 and a hold member 120.

The plural pin-shaped terminals 110 are arranged at a predefined pitch in a line in a direction as indicated by arrow X which is perpendicular to a connection direction of the multipolar connector 101 as indicated by arrow Y in FIG. 5. Each of the pin-shaped terminals 110 is formed by stamping and forming a metal plate to extend in the connection direction of the multipolar connector 101. Each of the pin-shaped terminals 110 includes a held section 111 extending in the connection direction and held by a hold member 120, a through hole connection section 112 extending from an upper end in the connection direction of the held section 111, and a surface mount connection section 113 extending from a lower end in the connection direction of the held section 111.

Here, the through hole connection section 112 is inserted into a through hole 42 (see FIG. 3) formed on the control circuit board 40 and soldered for connection. In some embodiments, the pin-shaped terminal 110 has two types, including a terminal having the through hole connection section 112 linearly extending upward from the upper end in the connection direction of the held section 111, and a terminal extending upward from the upper end in the connection direction of the held section 111 via a folded section 112a once folded frontward. Then, the pin-shaped terminal 110 in which the through hole connection section 112 linearly extends and the pin-shaped terminal 110 in which the through hole connection section 112 extends via the folded section 112a are alternately arranged in a direction as indicated by the arrow X which is perpendicular to the connection direction as indicated by the arrow Y. Thus, the through hole connection sections 112 are configured such that the pin-shaped terminal 110 linearly extends and the pin-shaped terminal 110 extends via the folded section 112a are alternately arranged. Hence, the through hole connection sections 112 are arranged in a staggered arrangement perpendicularly to the connection direction, and a high-density arrangement is enabled.

In addition, the surface mount connection section 113 in each pin-shaped terminal 110 is mounted on a surface of a conductive pad (not illustrated) on the board 31 in the semiconductor module 30, and is soldered for connection. Each surface mount connection section 113 includes a frontward extension section 113a once extending frontward from the lower end in the connection direction of the held section 111, a vertical section 113b extending downward from a front end of the frontward extension section 113a, and a solder connection section 113c extending backward from a lower end of the vertical section 113b and soldered for connection with the conductive pad.

Further, the hold member 120 is a member having a rectangular cross section extending in the direction as indicated by the arrow X which is perpendicular to the connection direction as indicated by the arrow Y, and is formed by molding an insulating resin. The hold member 120 holds the plural pin-shaped terminals 110 at a predefined pitch. By holding the plural pin-shaped terminals 110 with the hold member 120, positioning of the through hole connection section 112 and the surface mount connection section 113 in each pin-shaped terminal 110 can be carried out.

Then, protection sections 121 to protect particular ones of the plural pin-shaped terminals 110 are provided at parts in the extension direction of the hold member 120. The protection section 121 is configured to extend from the hold member 120 to protrude in the connection direction of the pin-shaped terminal 110 to be protected and to cover around the particular pin-shaped terminals 110.

The protection section 121 will be described concretely. The protection section 121 is provided at a first end part in the extension direction of the hold member 120 and at an inner part from a second end part of the hold member 120, spaced apart from the first end part by a predefined distance. Then, the two protection sections 121 respectively protect the pin-shaped terminal 110 located at a first outer end of the plural pin-shaped terminals arranged in a line (i.e., in which the through hole connection section 112 linearly extending upward from the upper end in the connection direction of the held section 111), and the pin-shaped terminal 110 at the inner part from the pin-shaped terminal 110 located at a second outer end spaced apart from the pin-shaped terminal 110 located at the first outer end (to be specific, the pin-shaped terminal 110 adjacent to the pin-shaped terminal 110 located at the second outer end, and in which the through hole connection section 112 linearly extending upward from the upper end in the connection direction of the held section 111). The two protection sections 121 each have a cylindrical shape that extend from the hold member 120 to protrude in the connection direction of the pin-shaped terminal 110 and covers the circumference of the corresponding pin-shaped terminal 110. The protrusion amount of each protection section 121 from the hold member 120 is configured such that, even when the amount is maximum, the through hole connection section 112 is exposed to allow the insertion for connection with the through hole 42 of the control circuit board 40. Then, the two protection sections 121 are integrally formed with the hold member 120. For this reason, the two protection sections 121 can be manufactured together with the hold member 120 in a simple manufacturing process.

An inclined face 122 is provided at the tip in the connection direction of each protection section 121. Hence, even when the pin-shaped terminals receive bending loads in the assemble operation or the like, the stress concentration on the boundary between the pin-shaped terminals 110 and the protection sections 121 can be prevented.

In addition, the hold member 120 and the protection section 121 are formed by insert molding together with the plural pin-shaped terminals. Thus, it is possible to manufacture the multipolar connector 101 in a simple manufacturing process.

Further, on a side part of the protection section 121, there is provided an opening section 123 for a holding jig that suppresses the deformation of the pin-shaped terminals to be protected at the time of insert molding. Accordingly, by holding the pin-shaped terminals 110 with the holding jig from the opening section 123 at the time of insert molding, it is possible to prevent the deformation of the pin-shaped terminals 110.

Next, the power and signal connector 50 is used for inputting the direct-current power supply from the battery (not illustrated) to the semiconductor module 30, and inputting various signals including the signals from the torque sensor 12 and the speed sensor 9 to the control circuit board 40. The power and signal connector 50 is attached to the power and signal connector mount section 22 provided in the semiconductor module mount section 21 by plural attachment screws 51 as illustrated in FIG. 3.

Then, the three-phase output connector 60 is used to output electrical currents from the a-phase output terminal 92a, the b-phase output terminal 92b, and the c-phase output terminal 92c. The three-phase output connector 60 is attached to the three-phase output connector mount section 23 provided at an end part in the width direction of the semiconductor module mount section 21 by the plural attachment screws 61, as illustrated in FIG. 3. The plural through openings 60*a* through which the attachment screws 61 are inserted are provided in the three-phase output connector 60, respectively.

Moreover, the cover 70 is attached onto the case 20 to which the semiconductor module 30, the control circuit board 40, the power and signal connector 50, and the three-phase output connector 60 are attached so as to cover the control circuit board 40 from above of the control circuit board 40, as illustrated in FIG. 3.

Next, a method of attaching the semiconductor module 30 and the control circuit board 40 to the case 20 will be described in detail.

Firstly, the semiconductor module 30 on which the multipolar connectors 101 are mounted is attached to the semiconductor module mount section 21 of the case 20 with the plural attachment screws 38, as illustrated in FIG. 3. When the multipolar connectors 101 are mounted on the semiconductor module 30, the surface mount connection sections 113 of the plural pin-shaped terminals 101 110 are soldered for connection to the conductive pad on the board 31.

Before the semiconductor module 30 is attached onto the semiconductor module mount section 21, the heat radiation sheet 39 is attached onto the semiconductor module mount section 21, and the semiconductor module 30 is attached from above of the heat radiation sheet 39. The heat radiation sheet 39 radiates the heat generated by the semiconductor module 30 to the case 20 via the heat radiation sheet 39.

After the semiconductor module 30 on which the multipolar connectors 101 are mounted is mounted on the semiconductor module mount section 21, the control circuit board 40 is attached onto the plural attachment posts 24 standing on the semiconductor module mount section 21 and the power and signal connector mount section 22 with the plural attachment screws 41 from above of the semiconductor module 30. Thus, the semiconductor module 30 and the control circuit board 40 can be attached to the case 20.

At this time, the through hole connection sections 112 of the respective pin-shaped terminals 110 of the multipolar connector 101 mounted on the semiconductor module 30 are inserted into the through holes 42 of the control circuit board 40, respectively, and are soldered for connection.

In this situation, since the plural pin-shaped terminals 110 are held at a predefined pitch by the hold member 120, positioning of the through hole connection sections 112 in the respective pin-shaped terminals 110 is carried out. For this reason, the through hole connection sections 112 of the respective pin-shaped terminals 110 are inserted into the through holes 42 of the control circuit board 40 appropriately and smoothly.

On the other hand, as each pin-shaped terminal 110 of metal plate is elongated in the connection direction, in this assembly operation, the pin-shaped terminal 110 may be deformed by some kind of external force. When an external force is exerted to a particular pin-shaped terminal 110 of the plural pin-shaped terminals 110 and then the particular pin-shaped terminal 110 is deformed, not only the particular pin-shaped terminal 110 may suffer from positional displacement but also other pin-shaped terminals 110 may suffer from the positional displacement via the hold member 120.

In contrast, in the multipolar connector 101 in some embodiments of the present disclosure, the protection sections 121 are provided at the first end part in the extension direction of the hold member 120 and at an inner part from the second end part of the hold member 120 spaced apart from the first end part by a predefined distance. The above-described protection sections 121 protect the pin-shaped terminal 110 located at the first outer end of the plural pin-shaped terminals 110 arranged in a line and the pin-shaped terminal 110 located at the inner part from the second outer end spaced apart by a predefined distance from the pin-shaped terminal 110 located at the first outer end. Therefore, in the plural pin-shaped terminals 110 arranged in a line, the pin-shaped terminal 110 located at the first outer end on which an external force is most easily exerted when the multipolar connector 101 is connected to the circuit board, when the multipolar connector 101 is transported, or the like, and the pin-shaped terminal 110 at the inner part from the pin-shaped terminal 110 located at the second outer end and spaced apart from the pin-shaped terminal 110 located at the first outer end by a predefined distance can be protected by the protection sections 121. Accordingly, even if some kind of external force is exerted onto the pin-shaped terminal 110 located at the first outer end and the pin-shaped terminal 110 at the inner part from the pin-shaped terminal 110 located at the second outer end spaced apart from the pin-shaped terminal 110 located at the first outer end by a predefined distance, it is possible to prevent the deformation of the above-described pin-shaped terminals 110. The positional displacement of one pin-shaped terminal 110 can be avoided, and in addition, the positional displacement of another pin-shaped terminal 110 caused by the deformation of the one pin-shaped terminal 110 can be avoided, too. Accordingly, the pin-shaped terminals 110 of the multipolar connector 101 can be inserted into the through holes 42, respectively, of the control circuit board 40 appropriately and smoothly.

In addition, the protection section 121 is configured to cover around the through hole connection section 112 and to protect the through hole connection section 112. Therefore, the deformation of the through hole connection section 112 can be prevented, and in addition, the positional displacement can be prevented. Accordingly, the through hole connection sections 112 can be inserted into the through holes 42, respectively, of the control circuit board 40 appropriately and smoothly.

Thus, since the through hole connection sections 112 of the respective pin-shaped terminals can be inserted into the through holes 42, respectively, of the control circuit board 40 appropriately and smoothly, it is possible to solder and connect the through hole connection sections 112 stably and suppress a variation in electrical conductivity in each pin-shaped terminal 110.

Figure 9A:
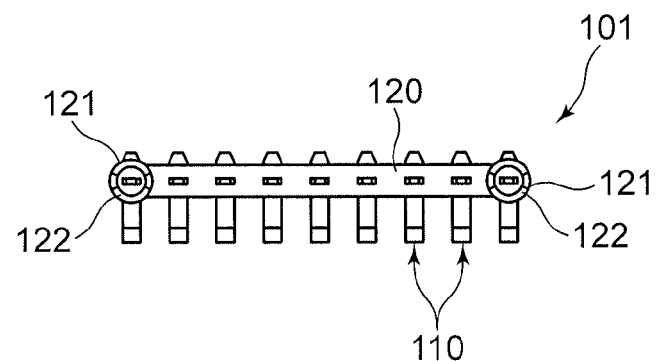
FIG. 9A is a plane view of the multipolar connector of FIG. 8.
Figure 9B:
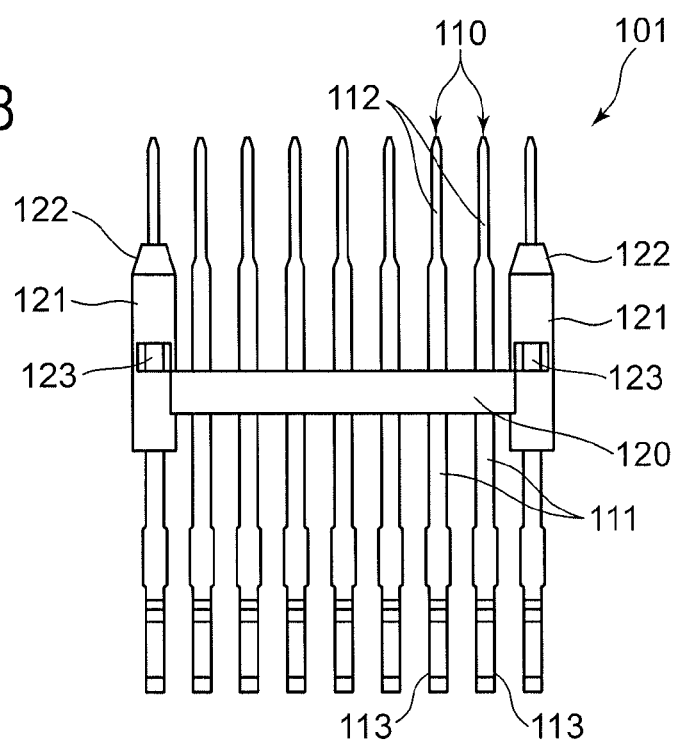
FIG. 9B is a front view of the multipolar connector of FIG. 8.
Figure 9C:
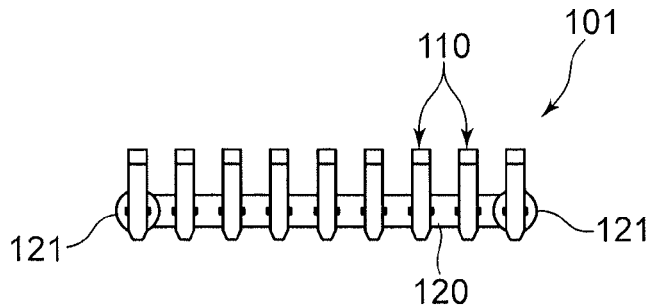
FIG. 9C is a bottom view of the multipolar connector of FIG. 8.
Figure 10:
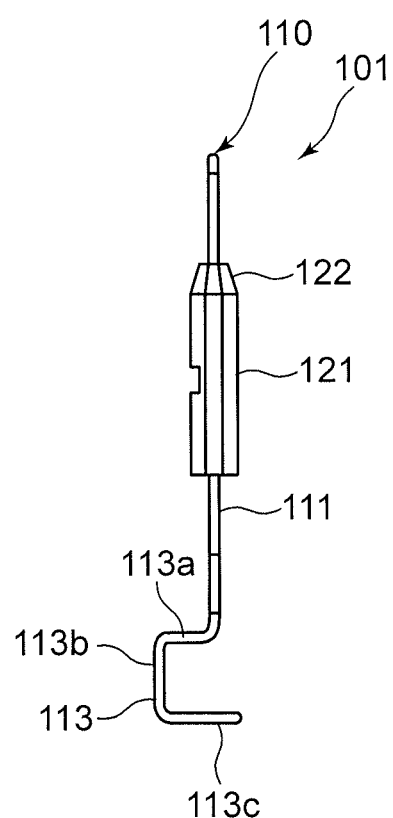
FIG. 10 is a right side view of the multipolar connector of FIG. 8.

Next, a first modification example of the multipolar connector 101 will be described with reference to FIG. 8 to FIG. 10. FIG. 8 is a perspective view of a first modification example of the multipolar connector. FIG. 9A is a plane view of the multipolar connector of FIG. 8. FIG. 9B is a front view of the multipolar connector of FIG. 8. FIG. 9C is a bottom view of the multipolar connector of FIG. 8. FIG. 10 is a right side view of the multipolar connector of FIG. 8. In FIG. 8 to FIG. 10, the same members with those illustrated in FIG. 5 to FIG. 7B have the same reference numerals, and the descriptions will be omitted in some cases.

The multipolar connector 101 illustrated in FIG. 8 to FIG. 10 has the same basic configuration as that of the multipolar connector 101 illustrated in FIG. 5 to FIG. 7B. However, they are different in the shapes of the pin-shaped terminals 110 and the arranged locations of the protection sections 121.

That is, in the multipolar connector 101 illustrated in FIG. 8 to FIG. 10, plural pin-shaped terminals 110 are arranged in a line at a predefined pitch in the direction as indicated by arrow X perpendicular to the connection direction as indicated by arrow Y in FIG. 8. Each of the pin-shaped terminals 110 is formed by stamping and bending a metal plate to extend in the connection direction. Each of the pin-shaped terminals 110 includes the held section 111 extending in the connection direction and held by the hold member 120, the through hole connection section 112 extending from an upper end in the connection direction of the held section 111, and the surface mount connection section 113 extending from a lower end in the connection direction of the held section 111.

Here, the through hole connection sections 112 are inserted into the through holes 42 (see FIG. 3), respectively, provided in the control circuit board 40, and are soldered for connection. In this first modification example, the pin-shaped terminals 110 are different from those illustrated in FIG. 5 to FIG. 7B. The pin-shaped terminals 110 has one type in which the through hole connection section 112 linearly extends upward from the upper end in the connection direction of the held section 111.

In addition, the surface mount connection section 113 in each pin-shaped terminal 110 is mounted on a surface of a conductive pad (not illustrated) on the board 31 in the semiconductor module 30, and is soldered for connection. Each surface mount connection section 113 includes the frontward extension section 113a once extending frontward from the lower end in the connection direction of the held section 111, the vertical section 113b extending downward from a front end of the frontward extension section 113a, and the solder connection section 113c extending backward from a lower end of the vertical section 113b and soldered for connection with the conductive pad.

Further, the hold member 120 is a member having a rectangular cross section extending in the direction as indicated by the arrow X perpendicular to the connection direction as indicated by the arrow Y, and is formed by molding an insulating resin. The hold member 120 holds the plural pin-shaped terminals 110 at a predefined pitch. By holding the plural pin-shaped terminals 110 with the hold member 120, positioning of the through hole connection section 112 and the surface mount connection section 113 in each pin-shaped terminal 110 is carried out.

Then, the protection sections 121 configured to protect the particular pin-shaped terminals 110 of the plural pin-shaped terminals 110 are provided at parts in the extension direction of the hold member 120, respectively. The protection sections 121 are configured to extend from the hold member 120 to protrude in the connection direction of the particular pin-shaped terminal 110 to be protected and to cover around the particular pin-shaped terminal 110, respectively. A protrusion amount of each protection section 121 from the hold member 120 is configured such that, even when the amount is maximum, the through hole connection section 112 is exposed and can be inserted for connection with the through hole 42 of the control circuit board 40. Each protection section 121 has a cylindrical shape.

As to the protection sections 121 specifically, the protection sections 121 are provided on both end parts, respectively, in the extension direction of the hold member 120. The two protection sections 121 provided on both end parts, respectively, in the extension direction of the hold member 120 are configured to protect the pin-shaped terminals 110 located on both outer ends of the plural pin-shaped terminals 110 arranged in a line.

According to the multipolar connector 101 in the present embodiment, it is possible for the protection sections 121 to protect the pin-shaped terminals 110 located on both outer ends, of the pin-shaped terminals 110 arranged in a line, onto which external forces are easily exerted when the multipolar connector 101 is connected to the control circuit board 40, respectively, when the multipolar connector 101 is transported, or the like. Accordingly, even if some kind of external force is exerted onto the pin-shaped terminals 110 located on both outer ends, it is possible to prevent the deformation of the pin-shaped terminals 110. It is possible to prevent the positional displacement of the pin-shaped terminals 110 on both outer ends, and it is also possible to prevent the positional displacement of other pin-shaped terminals 110 caused by the deformation of the pin-shaped terminals 110 on both outer ends. Therefore, the pin-shaped terminals 110 of the multipolar connector 101 can be inserted into the through holes 42, respectively, of the control circuit board 40 appropriately and smoothly.

In addition, the protection section 121 is configured to cover around the through hole connection section 112 and protect the through hole connection section 112. Therefore, the deformation of the through hole connection section 112 can be prevented, and the positional displacement can be prevented. Accordingly, the through hole connection sections 112 can be inserted into the through holes 42, respectively, of the control circuit board 40 appropriately and smoothly.

Thus, since the through hole connection sections 112 of the respective pin-shaped terminals can be inserted into the through holes 42, respectively, of the control circuit board 40 appropriately and smoothly, it is possible to solder and connect the through hole connection sections 112 stably and suppress a variation in electrical conductivity in each pin-shaped terminal 110.

Figure 11A:
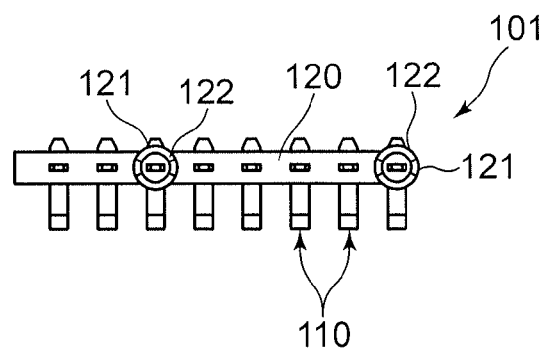
FIG. 11A is a plane view of the multipolar connector in a second modification example.
Figure 11B:
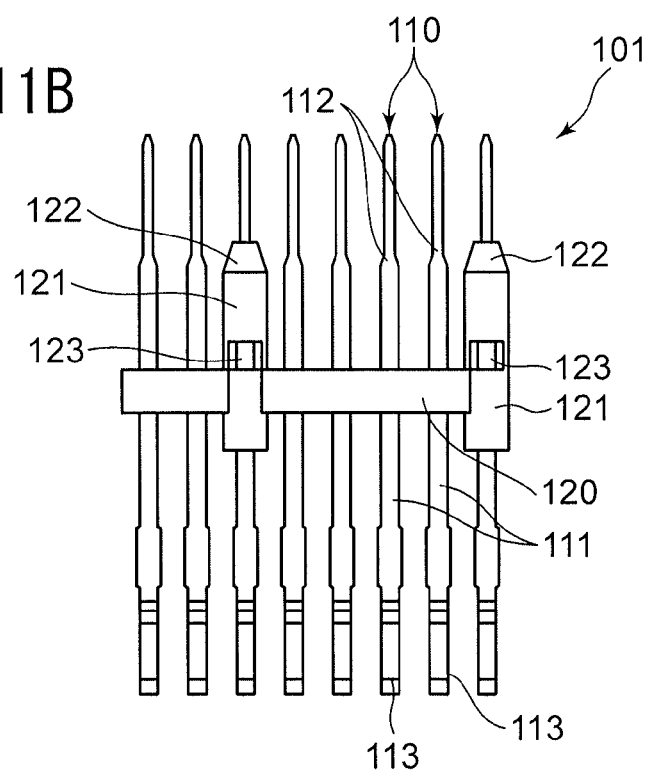
FIG. 11B is a front view of the multipolar connector in the second modification example.
Figure 11C:
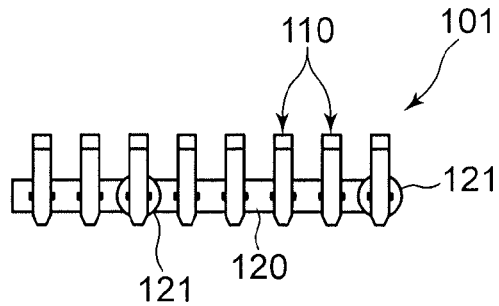
FIG. 11C is a bottom view of the multipolar connector in the second modification example.
Figure 12A:
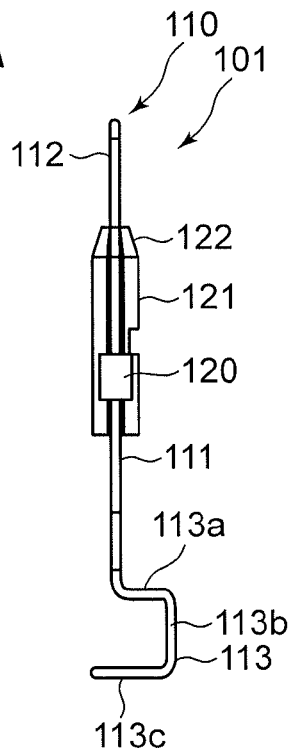
FIG. 12A is a left side view of the multipolar connector of FIG. 11A o FIG. 11C.
Figure 12B:
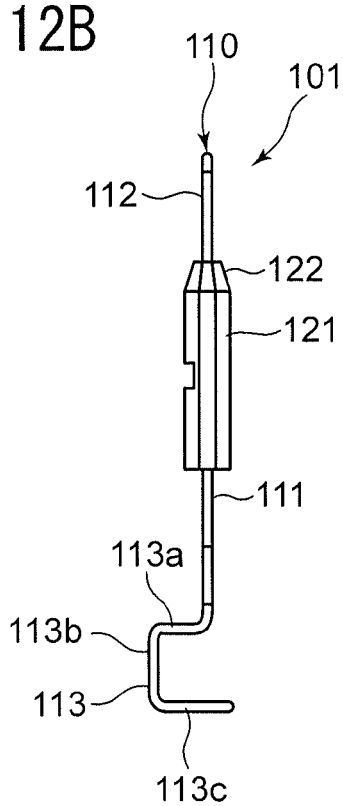
FIG. 12B is a right side view of the multipolar connector of FIG. 11A o FIG. 11C.
Figure 13:
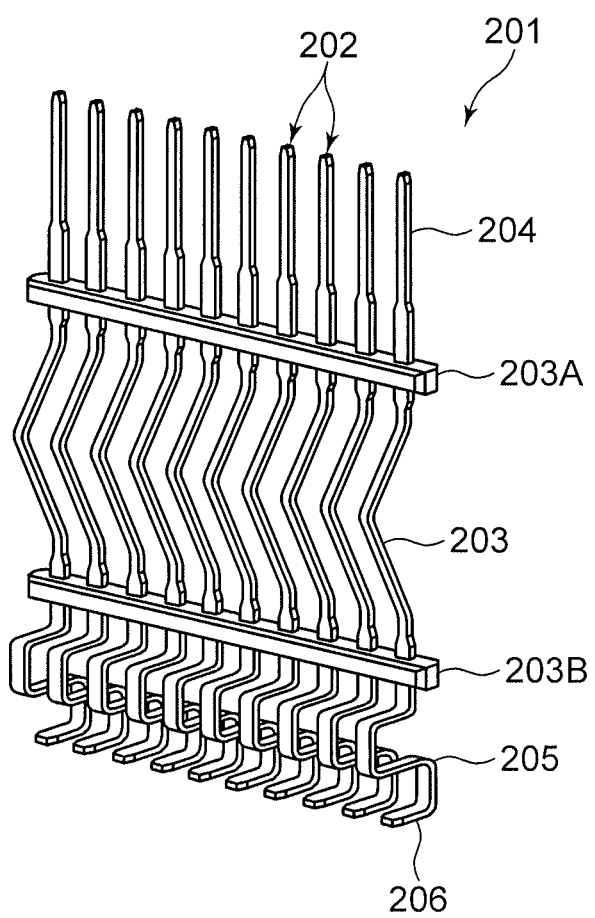
FIG. 13 is a perspective view illustrative of an example of the multipolar connector for interconnecting the circuit boards, on each of which electronic parts are mounted, in one technology.
Figure 14A:
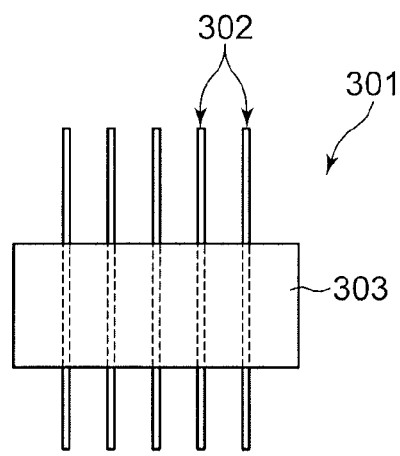
FIG. 14A is a front view of another example of the multipolar connector for interconnecting the circuit boards, on each of which electronic parts are mounted, in one technology.
Figure 14B:
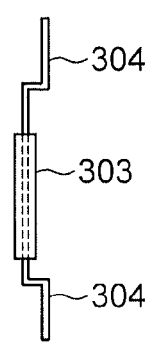
FIG. 14B is a right side view of another example of the multipolar connector for interconnecting the circuit boards, on each of which electronic parts are mounted, in one technology.
Figure 15:
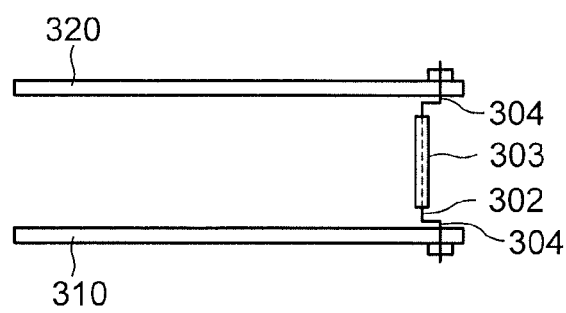
FIG. 15 schematically illustrates two wiring boards being interconnected by the multipolar connector illustrated in FIG. 14A and FIG. 14B.
Figure 16:
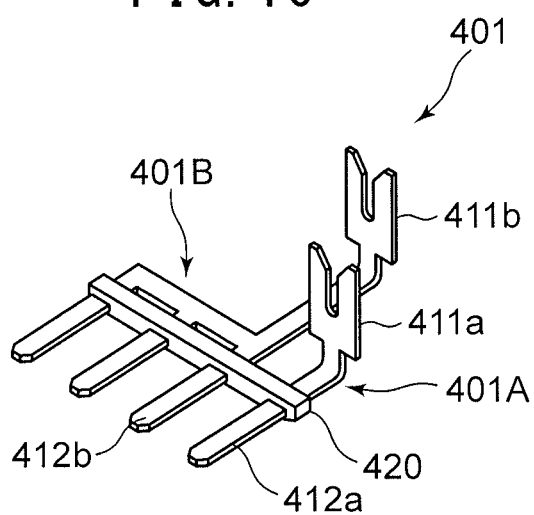
FIG. 16 is a perspective view illustrative of yet another example of the multipolar connector, in one technology.

Next, a second modification example of the multipolar connector 101 will be described with reference to FIG. 11A to FIG. 12B. FIG. 11A is a plane view of the multipolar connector in the second modification example. FIG. 11B is a front view of the multipolar connector in the second modification example. FIG. 11C is a bottom view of the multipolar connector in the second modification example. FIG. 12A is a left side view of the multipolar connector of FIG. 11A to FIG. 11C. FIG. 12B is a right side view of the multipolar connector of FIG. 11A to FIG. 11C. In FIG. 11A to FIG. 12B, the same members with those illustrated in FIG. 5 to FIG. 7B have the same reference numerals, and the descriptions will be omitted in some cases.

The multipolar connector 101 illustrated in FIG. 11A to FIG. 12B has the same basic configuration as that of the multipolar connector 101 illustrated in FIG. 8 to FIG. 10. However, the arranged locations of the protection sections 121 are different.

That is, in the multipolar connector 101 illustrated in FIG. 11A to FIG. 12B, the plural pin-shaped terminals 110 are arranged in a line at a predefined pitch in the direction perpendicular to the connection direction. Each of the pin-shaped terminals 110 is formed by stamping and forming a metal plate to extend in the connection direction. Each of the pin-shaped terminals 110 includes the held section 111 extending in the connection direction and held by the hold member 120, the through hole connection section 112 extending from an upper end in the connection direction of the held section 111, and the surface mount connection section 113 extending from a lower end in the connection direction of the held section 111.

Here, the through hole connection sections 112 are inserted into the through holes 42 (see FIG. 3), respectively, provided in the control circuit board 40, and are soldered for connection. In this second modification example, the pin-shaped terminals 110 have one type in a similar manner to those illustrated in FIG. 8 to FIG. 10. The through hole connection section 112 linearly extends upward from the upper end in the connection direction of the held section 111.

In addition, the surface mount connection section 113 in each pin-shaped terminal 110 is mounted on a surface of a conductive pad (not illustrated) on the board 31 in the semiconductor module 30, and is soldered for connection. Each surface mount connection section 113 includes the frontward extension section 113a once extending frontward from the lower end in the connection direction of the held section 111, the vertical section 113b extending downward from a front end of the frontward extension section 113a, and the solder connection section 113c extending backward from a lower end of the vertical section 113b and soldered for connection with the conductive pad.

Further, the hold member 120 is a member having a rectangular cross section extending in the direction perpendicular to the connection direction, and is formed by molding an insulating resin. The hold member 120 holds the plural pin-shaped terminals 110 at a predefined pitch. By holding the plural pin-shaped terminals 110 with the hold member 120, positioning of the through hole connection section 112 and the surface mount connection section 113 in each pin-shaped terminal 110 can be carried out.

Then, the protection sections 121 configured to protect particular ones of the plural pin-shaped terminals 110 are provided at parts in the extension direction of the hold member 120. The protection sections 121 are configured to extend from the hold member 120 to protrude in the connection direction of the pin-shaped terminals 110 to be protected and to cover around the pin-shaped terminals 110, respectively. Each protection section 121 has a cylindrical shape. The protrusion amount of each protection section 121 from the hold member 120 is configured such that, even when the amount is maximum, the through hole connection section 112 is exposed and can be inserted for connection with the through hole 42 of the control circuit board 40.

As to the protection sections 121 specifically, the protection sections 121 are different from those illustrated in FIG. 8 to FIG. 10. The protection sections 121 are respectively provided at the first end part in the extension direction of the hold member 120 and at an inner part from the second end part of the hold member 120 spaced apart from the first end part by a predefined distance. The two protection sections 121 are respectively configured to protect the pin-shaped terminal 110 arranged at the first outer end of the plural pin-shaped terminals 110 arranged in a line and the pin-shaped terminal 110 arranged at an inner part from the second outer end spaced apart from the pin-shaped terminal 110 arranged at the first outer end (to be specific, the pin-shaped terminal 110 located on an inner side by two terminals from the pin-shaped terminal 110 located at the second outer end).

According to the multipolar connector 101 in the present embodiment, in the plural pin-shaped terminals 110, it is possible for the protection sections 121 to protect the pin-shaped terminal 110 arranged at the first outer end, onto which an external force is most easily exerted when the multipolar connector 101 is connected to the control circuit board 40, when the multipolar connector 101 is transported, or the like, and to protect the pin-shaped terminal 110 arranged at an inner part from the second outer end spaced apart from the pin-shaped terminal 110 arranged at the first outer end. Accordingly, even if some kind of external force is exerted onto the pin-shaped terminal 110 arranged at the first outer end and the pin-shaped terminal 110 arranged at an inner part from the second outer end spaced apart from the pin-shaped terminal 110 arranged at the first outer end, it is possible to prevent the deformation of the particular pin-shaped terminals 110. The positional displacement of the particular pin-shaped terminals 110 can be avoided, and in addition, the positional displacement of other pin-shaped terminals 110 caused by the deformation of the particular pin-shaped terminals 110 can be avoided, too. Accordingly, the pin-shaped terminals 110 of the multipolar connector 101 can be inserted into the through holes 42, respectively, of the control circuit board 40 appropriately and smoothly.

In addition, the protection section 121 is configured to cover around the through hole connection section 112 and protect the through hole connection section 112. Therefore, the deformation of the through hole connection section 112 can be prevented, and in addition, the positional displacement can be prevented. Accordingly, the through hole connection sections 112 can be inserted into the through holes 42, respectively, of the control circuit board 40 appropriately and smoothly.

Thus, since the through hole connection sections 112 of the respective pin-shaped terminals can be inserted into the through holes 42, respectively, of the control circuit board 40 appropriately and smoothly, it is possible to solder and connect the through hole connection sections 112 stably and suppress a variation in electrical conductivity in each pin-shaped terminal 110.

Heretofore, embodiments of the present disclosure have been described, but the present disclosure is not limited to the above-described embodiments and various changes and modifications may be applicable.

For example, the plural pin-shaped terminals 110 that are provided in the direction perpendicular to the connection direction are not necessarily arranged in a line. Plural lines of the plural pin-shaped terminals 110 may be provided.

In addition, as to the arrangements of the protection sections 121, when the two protection sections 121 protect the pin-shaped terminal 110 located at the first outer end and the pin-shaped terminal 110 located at an inner part from the second outer end spaced apart from the pin-shaped terminal 110 located at the first outer end, respectively, of the plural pin-shaped terminals 110 arranged in a line, as illustrated in FIG. 5 to FIG. 7B and FIG. 11A to FIG. 12B, the present disclosure is not limited to the case where the two protection sections 121 protect the pin-shaped terminals 110 located on both end parts, respectively, of the plural pin-shaped terminals 110 arranged in a line. The protection section 121 may be provided at a part of the hold member 120, so that the protection section 121 may protect a particular one of the plural pin-shaped terminals 110.

By providing the protection section 121 at apart of the hold member 120 so that the protection section 121 may protect a particular one of the plural pin-shaped terminals 110, it is made possible for the protection section 121 to protect the particular pin-shaped terminal 110 when the multipolar connector 101 is connected to the control circuit board 40, when the multipolar connector 101 is transported, or the like. Even if some kind of external force is exerted onto the particular pin-shaped terminal 110, it is possible to prevent the deformation of the particular pin-shaped terminal 110. Accordingly, the positional displacement of the particular pin-shaped terminals 110 can be avoided, and in addition, the positional displacement of other pin-shaped terminals 110 caused by the deformation of the particular pin-shaped terminals 110 can be avoided, too. Thus, the pin-shaped terminals 110 of the multipolar connector 101 can be inserted into the through holes 42, respectively, of the control circuit board 40 appropriately and smoothly.

Additionally, any number of the protection sections 121 is applicable, and the protection sections 121 may be configured to cover all of the pin-shaped terminals 110.

Further, the protection section 121 does not necessarily have a cylindrical shape, as long as the protection section 121 extends from the hold member 120 to protrude in the connection direction of the pin-shaped terminal 110 to be protected and to cover around the pin-shaped terminal 110 to be protected.

Furthermore, the inclined face 122 is not necessarily provided at the tip in the connection direction of each protection section 121.

Moreover, the hold member 120 and the protection section 121 are not necessarily formed by insert molding.

Further, the opening section 123 for the holding jig that suppresses the deformation of the pin-shaped terminals to be protected at the time of insert molding is not necessarily provided on a side part of the protection section 121.

In addition, in the above-described multipolar connector, the protection section may be integrally formed with the hold member.

When the protection section is integrally formed with the hold member, the protection section can be produced with the hold member in a simple production process.

Further, in the above-described multipolar connector, the protection section may be provided at least at one end part in an extension direction of the hold member to protect at least one pin-shaped terminal located at one outer end of the plurality of pin-shaped terminals arranged in the line.

According to the above-described multipolar connector, it is possible for the protection sections to protect the pin-shaped terminal arranged at an outer end, onto which an external force is most easily exerted when the multipolar connector is connected to the circuit board, when the multipolar connector is transported, or the like.

Moreover, in the above-described multipolar connector, the protection sections may be provided at both end parts in the extension direction of the hold member to protect the pin-shaped terminals located at both outer ends of the plurality of pin-shaped terminals arranged in the line.

Accordingly, even if some kind of external force is exerted onto the pin-shaped terminals located on both outer ends, it is possible to prevent the deformation of the pin-shaped terminals located on both outer ends. It is possible to prevent the positional displacement of the pin-shaped terminals on both outer ends, and it is also possible to prevent the positional displacement of other pin-shaped terminals caused by the deformation of the pin-shaped terminals on both outer ends. Therefore, the pin-shaped terminals of the multipolar connector can be inserted into the through holes, respectively, of the circuit board appropriately and smoothly.

Additionally, in the above-described multipolar connector, the protection sections may be provided at a first end part in the extension direction of the hold member and at an inner part from a second end part of the hold member, the inner part being spaced apart from the first end part by a predefined distance, and the protection sections may be configured to protect a pin-shaped terminal located at the first outer end of the plurality of pin-shaped terminals arranged in the line and another pin-shaped terminal located at an inner part from a second outer end, the inner part being spaced apart from the pin-shaped terminal located at the first outer end by a predefined distance.

According to the above-described multipolar connector, it is possible for the protection sections to protect the pin-shaped terminal located at the first outer end of the plurality of pin-shaped terminals arranged in the line and the another pin-shaped terminal located at an inner part from a second outer end, the inner part being spaced apart from the pin-shaped terminal located at the first outer end by a predefined distance.

In addition, in the above-described multipolar connector, an inclined face may be formed at a tip in the connection direction of the protection section.

In the case where the inclined face is provided at a tip in the connection direction of the protection section, even when the pin-shaped terminals receive bending loads in the assembly operation or the like, the stress concentration on the boundary between the pin-shaped terminals and the protection sections can be prevented.

Further, in the above-described multipolar connector, the hold member and the protection section may be formed by insert molding together with the plurality of pin-shaped terminals.

According to the above-described multipolar connector, by forming the hold member and the protection section by insert molding together with the plurality of pin-shaped terminals, it is made possible to produce the multipolar connector in a simple production process.

Furthermore, an opening section for a holding jig may be provided to suppress deformation of the plurality of pin-shaped terminals at the time of insert molding.

When the opening section for a holding jig is provided to suppress deformation of the plurality of pin-shaped terminals at the time of insert molding, it is possible to prevent the deformation of the plurality of pin-shaped terminals by holding the plurality of pin-shaped terminals from the opening section at the time of insert molding.

Moreover, in the above-described multipolar connector, each of the plurality of pin-shaped terminals may include a held section extending in the connection direction and held by the hold member, a through hole connection section extending from one end in the connection direction of the held section and inserted into a through hole provided in a circuit board and soldered for connection, and a surface mount connection section extending from another end in the connection direction of the held section and mounted on a surface of another circuit board and soldered for connection.

Additionally, in the above-described multipolar connector, the protection section may be configured to cover around the through hole connection section and to protect the through hole connection section.

In this manner, when the protection section is configured to cover around the through hole connection section and to protect the through hole connection section, the deformation of the through hole connection section can be prevented and the positional displacement can also be prevented. Thus, the through hole connection sections can be inserted into the through holes, respectively, of the circuit board appropriately and smoothly.

Moreover, in another embodiment of the present disclosure, there is provided a multipolar connector, in which it is possible to prevent deformation of a particular one of a plurality of pin-shaped terminals arranged in a line in a direction perpendicular to a connection direction of the multipolar connector, and it is also possible to prevent positional displacement of the particular pin-shaped terminal and deformation of another pin-shaped terminal.

According to the multipolar connector in some embodiments of the present disclosure, a protection section to protect a particular pin-shaped terminal of plural pin-shaped terminals is provided at a part of a hold member to extend from the hold member to protrude in the connection direction of the particular pin-shaped terminal to be protected and cover around the particular pin-shaped terminal. Thus, it is possible for the protection section to protect the particular pin-shaped terminal when the multipolar connector is connected to the circuit board, when the multipolar connector is transported, or the like. Even if some kind of external force is exerted onto the particular pin-shaped terminal, it is possible to prevent deformation of the particular pin-shaped terminal. Accordingly, it is possible to prevent the deformation of the particular pin-shaped terminal, and in addition, possible to avoid the positional displacement of another pin-shaped terminal caused by the deformation of the particular pin-shaped terminal. For this reason, the respective pin-shaped terminals in the multipolar connector can be inserted into the through holes of the control circuit board appropriately and smoothly.

REFERENCE SIGNS LIST 1 steering wheel
2 column shaft
3 reduction gear
4A, 4B universal joint
5 rack and pinion mechanism
6 tight rod
7 torque sensor
8 electric motor
9 speed sensor
10 controller
11 control operation unit
12 gate drive circuit
13 motor drive unit
14 cutoff device for emergency stop
15 current detection circuit
16 rotation sensor
17 rotor position detection circuit
18 ignition voltage monitor section
19 power supply circuit section
20 case
21 semiconductor module mount section
21a screw opening
22 power supply and signal connector mount section
23 three-phase output connector mount section
23a screw opening
24 attachment post
24a screw opening
30 semiconductor module (power circuit board, one circuit board)
31 board
31a through opening
35 bare chip FET (bare chip transistor)
37 surface mount part
38 attachment screw
39 heat radiation sheet
40 control circuit board (another circuit board)
40a through opening
41 attachment screw
50 power and signal connector
51 attachment screw
60 three-phase output connector
60a through opening
61 attachment screw
70 cover
81 power line
81a positive terminal
82 ground line
82a negative terminal
90 three-phase output section
91a a-phase output line
91b b-phase output line
91c c-phase output line
101 multipolar connector
110 pin-shaped terminal
111 held section
112 through hole connection section
113 surface mount connection section
113a frontward extension section
113b vertical section
113c solder connection section
120 hold member
121 protection section
122 inclined face
123 opening section

The invention claimed is:

1. A multipolar connector, comprising:
a plurality of pin-shaped terminals extending in a first direction perpendicular to a second direction, and being arranged in the second direction in a single line;
a hold member extending in the second direction configured to hold the plurality of pin-shaped terminals at a predefined pitch; and
a first protection section and a second protection section integrally formed with the hold member configured to protect first and second protected pin-shaped terminals of the plurality of pin-shaped terminals at parts of the hold member, respectively, from stress caused by bending loads during a multipolar connector insertion event, wherein each of the first and second protected pin-shaped terminals includes a held section and a through hole connection section configured to receive a through hole of a circuit board, and the first protection section and the second protection section extend from the hold member to protrude in the first direction and cover around at least portions of the through hole connection section and the held section of the first and second protected pin-shaped terminals,
wherein the first protection section is provided to protect the first protected pin terminal located at one outer end of the plurality of pin-shaped terminals arranged in the second direction in the single line,
wherein the second protection section is provided to protect the second protected pin-shaped terminal separated from the first protected pin-shaped terminal at an inner side from an opposite outer end of the plurality of pin-shaped terminals arranged in the second direction in the single line, and
wherein the first protection section and the second protection section each includes an inclined face formed at an end away from the hold member in the first direction and a tip of the inclined face is arranged to cover around at least a portion of the through hole connection section.

2. The multipolar connector according to claim 1, wherein the hold member and the first and second protection sections are formed by insert molding together with the plurality of pin-shaped terminals.

3. The multipolar connector according to claim 2, wherein an opening section is arranged between the hold member and the inclined face in each of the first and second protection sections, for a holding jig configured to suppress deformation of the plurality of pin-shaped terminals at the time of insert molding.

4. The multipolar connector according to claim 1, wherein each of the plurality of pin-shaped terminals includes:
a held section extending in the first direction and held by the hold member;

a through hole connection section extending in the first direction from one end of the held section and inserted into a through hole provided in the circuit board and soldered for connection; and a surface mount connection section extending in the first direction from the other end of the held section and mounted on a surface of another circuit board and soldered for connection, wherein the plurality of pin-shaped terminals include a plurality of the through hole connection sections, respectively, and the plurality of the through hole connection sections include:

a plurality of straight through hole connection sections configured to linearly extend in the first direction from the one ends of the held sections to ends of the plurality of the through hole connection sections, and a plurality of bending through hole connection sections configured to linearly extend in the first direction from the one ends of the held sections through bending sections bending in third directions, and then linearly extend to the ends of the plurality of the through hole connection sections, wherein each of the plurality of straight through hole connection sections and each of the plurality of bending through hole connection sections are arranged alternately in the second direction in the single line.

5. A multipolar connector, comprising:

a plurality of pin-shaped terminals extending in a first direction perpendicular to a second direction, and being arranged in the second direction in a single line;

a hold member extending in the second direction configured to hold the plurality of pin-shaped terminals at a predefined pitch; and a first protection section and a second protection section integrally formed with the hold member configured to protect first and second protected pin-shaped terminals of the plurality of pin-shaped terminals at parts of the hold member, respectively, from stress caused by bending loads during a multipolar connector insertion event, the first protection section and the second protection section extend from the hold member to protrude in the first direction and to cover around the first and second protected pin-shaped terminals, wherein the first protection section is provided to protect the first protected pin terminal located at one outer end of the plurality of pin-shaped terminals arranged in the second direction in the single line, wherein the second protection section is provided to protect the second protected pin-shaped terminal separated from the first protected pin-shaped terminal by a given distance and located at an inner side from the other outer end of the plurality of pin-shaped terminals arranged in the second direction in the single line, wherein each of the plurality of pin-shaped terminals includes:

a held section extending in the first direction and held by the hold member;

a through hole connection section extending in the first direction from one end of the held section and inserted into a through hole provided in a circuit board and soldered for connection; and a surface mount connection section extending in the first direction from the other end of the held section and mounted on a surface of another circuit board and soldered for connection, and wherein each of the first protection section and the second protection section is configured to cover around at least portions of the through hole connection section and the held section and further configured to protect the through hole connection section.

* * * * *